(12) United States Patent
Nakamoto et al.

(10) Patent No.: US 10,637,262 B2
(45) Date of Patent: Apr. 28, 2020

(54) ENERGY STORAGE APPARATUS, VEHICLE, INTERNAL SHORT-CIRCUIT DETECTION CONTROLLING METHOD FOR ENERGY STORAGE APPARATUS, AND CHARGE CONTROLLING METHOD FOR ENERGY STORAGE APPARATUS

(71) Applicant: GS Yuasa International Ltd., Kyoto-shi (JP)

(72) Inventors: Takeshi Nakamoto, Kyoto (JP); Daisuke Konishi, Kyoto (JP)

(73) Assignee: GS YUASA INTERNATIONAL LTD., Kyoto-Shi, Kyoto (JP)

( * ) Notice: Subject to any disclaimer, the term of this patent is extended or adjusted under 35 U.S.C. 154(b) by 250 days.

(21) Appl. No.: 15/661,967

(22) Filed: Jul. 27, 2017

(65) Prior Publication Data

US 2018/0041055 A1 Feb. 8, 2018

(30) Foreign Application Priority Data

Aug. 5, 2016 (JP) ................................. 2016-154942

(51) Int. Cl.
*H02J 7/00* (2006.01)
*H02H 1/00* (2006.01)
*H01M 10/44* (2006.01)
*H01M 10/48* (2006.01)
*H01M 2/10* (2006.01)
(Continued)

(52) U.S. Cl.
CPC ...... *H02J 7/0031* (2013.01); *G01R 19/16542* (2013.01); *G01R 31/50* (2020.01); *H01M 2/1077* (2013.01); *H01M 2/34* (2013.01); *H01M 10/425* (2013.01); *H01M 10/44* (2013.01); *H01M 10/441* (2013.01); *H01M 10/482* (2013.01); *H02H 1/0007* (2013.01); *H02H 3/16* (2013.01); *H02H 7/18* (2013.01); *G01R 31/392* (2019.01); *H01M 2200/00* (2013.01);
(Continued)

(58) Field of Classification Search
CPC ............ H02J 7/0031; H02J 2007/0037; H02J 2007/004; G01R 19/16542; G01R 31/025; H01M 2/1077; H01M 2/34; H01M 10/425; H01M 10/44; H01M 10/441; H01M 10/482
USPC ........................................................ 361/101
See application file for complete search history.

(56) References Cited

U.S. PATENT DOCUMENTS

2013/0249496 A1 9/2013 Ju et al.
2013/0268158 A1* 10/2013 Kurita ....................... B60L 3/00
701/32.8

(Continued)

FOREIGN PATENT DOCUMENTS

JP 2007-187533 A 7/2007
JP 2013-160582 A 8/2013
(Continued)

*Primary Examiner* — Scott Bauer
(74) *Attorney, Agent, or Firm* — McGinn IP Law Group, PLLC

(57) ABSTRACT

An energy storage apparatus includes: an energy storage device; a voltage detecting unit for detecting a voltage of the energy storage device; an energization control unit for controlling energization of the energy storage device; and a control unit. The control unit performs a short-circuit detecting process for detecting an internal short-circuit based on a change in state of the energy storage device with charging of the energy storage device.

18 Claims, 11 Drawing Sheets

(51) Int. Cl.
  *H01M 2/34* (2006.01)
  *H02H 3/16* (2006.01)
  *H02H 7/18* (2006.01)
  *H01M 10/42* (2006.01)
  *G01R 19/165* (2006.01)
  *G01R 31/50* (2020.01)
  *G01R 31/392* (2019.01)

(52) U.S. Cl.
  CPC ...... *H01M 2220/20* (2013.01); *H02J 7/00302* (2020.01); *H02J 7/00306* (2020.01)

(56) References Cited

U.S. PATENT DOCUMENTS

| | | | |
|---|---|---|---|
| 2014/0247013 A1* | 9/2014 | Mizoguchi | H02J 7/0063 320/118 |
| 2014/0306659 A1* | 10/2014 | Nakajima | B60L 53/14 320/109 |
| 2016/0190830 A1* | 6/2016 | Kuhlmann | H02J 7/0026 320/116 |
| 2018/0041055 A1* | 2/2018 | Nakamoto | H01M 10/441 |
| 2018/0174784 A1* | 6/2018 | Kim | H01H 33/02 |

FOREIGN PATENT DOCUMENTS

| | | | | |
|---|---|---|---|---|
| JP | 2013-201888 A | | 10/2013 | |
| JP | 2014-166020 A | | 9/2014 | |
| JP | 6165404 B1 * | | 7/2017 | ............. A61B 17/04 |

\* cited by examiner

ENERGY STORAGE APPARATUS, VEHICLE, INTERNAL SHORT-CIRCUIT DETECTION CONTROLLING METHOD FOR ENERGY STORAGE APPARATUS, AND CHARGE CONTROLLING METHOD FOR ENERGY STORAGE APPARATUS

CROSS-REFERENCE TO RELATED APPLICATIONS

This application is based on Japanese Patent Application No. 2016-154942 filed on Aug. 5, 2016, the entire contents of which are hereby incorporated by reference.

FIELD

A technique disclosed in the present specification relates to an energy storage apparatus, a vehicle, and an internal short-circuit detection controlling method for an energy storage apparatus, and a charge controlling method for an energy storage apparatus.

BACKGROUND

An energy storage apparatus mounted on an automobile, for example, is used for starting an engine, supplying electric power to various vehicle loads, or charging power from an alternator. In the case where energy storage apparatuses of this type use a lithium ion battery having a copper foil used for a negative electrode substrate of an energy storage device, over discharging causes copper used for the negative electrode substrate to be eluded into an electrolyte solution.

If charging is performed in this state, eluded copper ions are turned to copper that is then deposited on an electrode. Thereafter, the deposited copper grows to cause the risk of an internal short-circuit in the energy storage device. In view of this, the energy storage apparatus is provided with a current breaking device (a breaker) for breaking a current to be supplied to a vehicle load and a battery control unit for controlling the current breaking device. The battery control unit breaks a current at the current breaking device so as to prevent the energy storage apparatus from being overcharged or overdischarged. A battery disclosed in JP 2013-201888 A exemplifying this technique has been known.

When the current breaking device breaks a current in the energy storage apparatus of this type, the energy storage apparatus cannot be charged even if an outside charger or the like is connected to the energy storage apparatus. In other words, even if no internal short-circuit occurs at the energy storage device in the energy storage apparatus, the energy storage apparatus cannot be used.

SUMMARY

The following presents a simplified summary of the invention disclosed herein in order to provide a basic understanding of some aspects of the invention. This summary is not an extensive overview of the invention. It is intended to neither identify key or critical elements of the invention nor delineate the scope of the invention. Its sole purpose is to present some concepts of the invention in a simplified form as a prelude to the more detailed description that is presented later.

The present specification discloses a technique for detecting whether or not an internal short-circuit occurs at an energy storage apparatus.

An energy storage apparatus according to an aspect of the present invention includes: an energy storage device; a voltage detecting unit for detecting a voltage of the energy storage device; an energization control unit for controlling the energization of the energy storage device; and a control unit, wherein the control unit performs a short-circuit detecting process for detecting an internal short-circuit based on a change in state of the energy storage device with charging of the energy storage device.

BRIEF DESCRIPTION OF DRAWINGS

The foregoing and other features of the present invention will become apparent from the following description and drawings of an illustrative embodiment of the invention in which.

DESCRIPTION OF EMBODIMENTS

Figure 1:
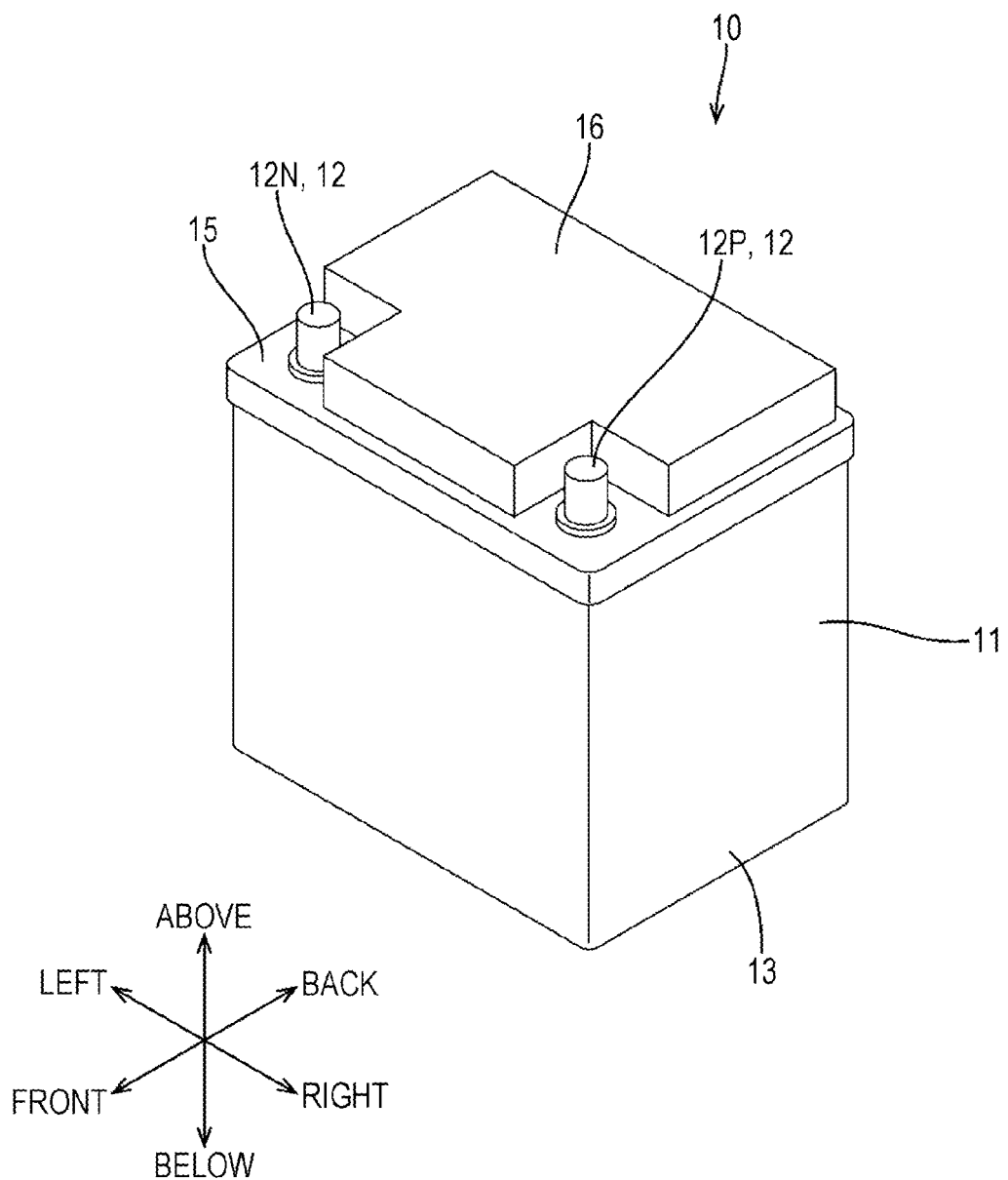
FIG. 1 is a perspective view showing an energy storage apparatus in a first embodiment.

An energy storage apparatus according to an aspect of the present invention includes: an energy storage device; a voltage detecting unit for detecting a voltage of the energy storage device; an energization control unit for controlling energization of the energy storage device; and a control unit, wherein the control unit performs a short-circuit detecting process for detecting an internal short-circuit based on a change in state of the energy storage device with charging of the energy storage device.

With this configuration, the energization control unit controls the energization of the energy storage device to charge the energy storage device, and an internal short-circuit can be detected based on the change in state of the energy storage device during or after charging. Thus, it is possible to determine whether or not the energy storage device can be used.

Outline of Present Embodiment

First, explanation will be made on an energy storage apparatus, a vehicle, an internal short-circuit detection controlling method for an energy storage apparatus, a charge controlling method for an energy storage apparatus disclosed in the present specification.

An energy storage apparatus in the present embodiment includes: an energy storage device; a voltage detecting unit for detecting a voltage of the energy storage device; an energization control unit for controlling energization of the energy storage device; and a control unit, wherein the control unit performs a short-circuit detecting process for detecting an internal short-circuit based on a change in state of the energy storage device with charging of the energy storage device.

The energy storage apparatus may be configured as an energy storage apparatus for starting an engine for a vehicle.

Additionally, a vehicle may be configured using the energy storage apparatus mounted thereon.

According to the energy storage apparatus having the above-described configuration, the energization control unit controls the energization of the energy storage device to charge the energy storage device, and an internal short-circuit can be detected based on the change in state of the energy storage device during or after charging. As a consequence, it is possible to determine whether or not the energy storage device can be used.

The control unit may detect the internal short-circuit of the energy storage device if a change in voltage of the energy storage device during charging in the short-circuit detecting process deviates from a predetermined reference range.

In an internal short-circuit detection controlling method for an energy storage apparatus having an energy storage device, a short-circuit detecting process is performed in which an internal short-circuit of the energy storage device is detected if a change in voltage of the energy storage device during charging deviates from a predetermined reference range.

With this configuration, the confirmation of a change in voltage of the energy storage device during charging enables the detection of the internal short-circuit of the energy storage device.

The energy storage device may include a plurality of energy storage devices connected in series, wherein the control unit may compare changes in state of the energy storage devices after charging in the short-circuit detecting process to detect the internal short-circuit of the energy storage device.

With this configuration, the confirmation of a change in voltage of the energy storage device after charging enables the detection of the internal short-circuit of the energy storage device.

The energy storage device may include a plurality of energy storage devices connected in series, wherein the control unit may determine whether a change in voltage of the energy storage device during charging in the short-circuit detecting process deviates from a predetermined reference range and may compare changes in state of the energy storage devices after charging in the short-circuit detecting process to detect the internal short-circuit of the energy storage device.

With this configuration, the internal short-circuit of the energy storage device is detected based on the results of a change in voltage of the energy storage device during charging and the comparison between changes in state of the energy storage devices after charging, and therefore, the detection accuracy of the internal short-circuit can be enhanced.

The control unit may perform the short-circuit detecting process a plurality of times.

With this configuration, the internal short-circuit detecting process for charging the energy storage device and detecting an internal short-circuit is repeated a plurality of times, and therefore, the detection accuracy of the internal short-circuit can be further enhanced.

The control unit may perform the short-circuit detecting process after performing a breaking process for breaking the energization of the energy storage device when the voltage of the energy storage device becomes lower than a predetermined voltage, and may perform a breakage releasing process for releasing the breakage of the energy storage device energization to enable the energy storage device to be charged again if no internal short-circuit of the energy storage device is detected in the short-circuit detecting process.

Furthermore, a charge controlling method for an energy storage apparatus having an energy storage device may include: breaking energization of the energy storage device when the voltage of the energy storage device becomes lower than a predetermined voltage; detecting an internal short-circuit based on a change in state of the energy storage device with charging of the energy storage device after the breaking; and releasing the breakage of the energy storage device energization if no internal short-circuit of the energy storage device is detected to enable the energy storage device to be charged again.

With this configuration, in the case where the voltage of the energy storage device becomes lower than the predetermined voltage so that the energy storage device is turned into an overdischarged state, the energization of the energy storage device is broken. Then, in the case where the energy storage device is charged and no internal short-circuit is detected, the breakage of the energy storage device energization is released, thus making it possible to use the energy storage apparatus. As a consequence, it is possible to use the energy storage apparatus until an internal short-circuit occurs at the energy storage device, thus prolonging the lifetime of the energy storage apparatus.

The energization control unit may include: a current breaking device for breaking an energization path to the plurality of energy storage devices; and a waveform-shaping circuit connected in parallel to the current breaking device, wherein the control unit may break the energization path and switch the energization of the plurality of energy storage devices to energization via the waveform-shaping circuit to charge the energy storage devices.

With this configuration, in the case where a charge current is switched in such a manner as to pass the waveform-shaping circuit, the charge current can be smoothened by shaping the waveform of an applied voltage from a charger, thus facilitating the detection of the internal short-circuit based on a change in state of the energy storage device.

First Embodiment

One embodiment of a technique disclosed in the present specification will be described with reference to FIG. 1 to FIG. 9.

Figure 9:
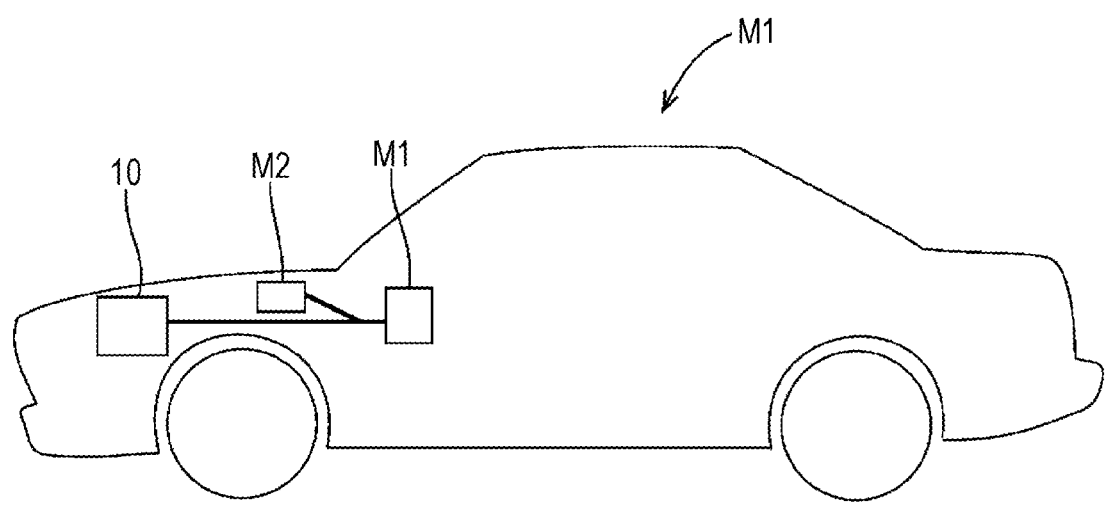
FIG. 9 is a view showing the energy storage apparatus mounted on an automobile.

In the present embodiment, FIG. 9 shows an energy storage apparatus 10 for starting an engine mounted on an engine room, not shown, of a vehicle M such as an automobile. The energy storage apparatus 10 supplies electric power to an electronic control device M1 for a vehicle, and furthermore, is connected to a charger M2 on a vehicle side such as an alternator to be controlled by the electronic control device M1.

Figure 2:
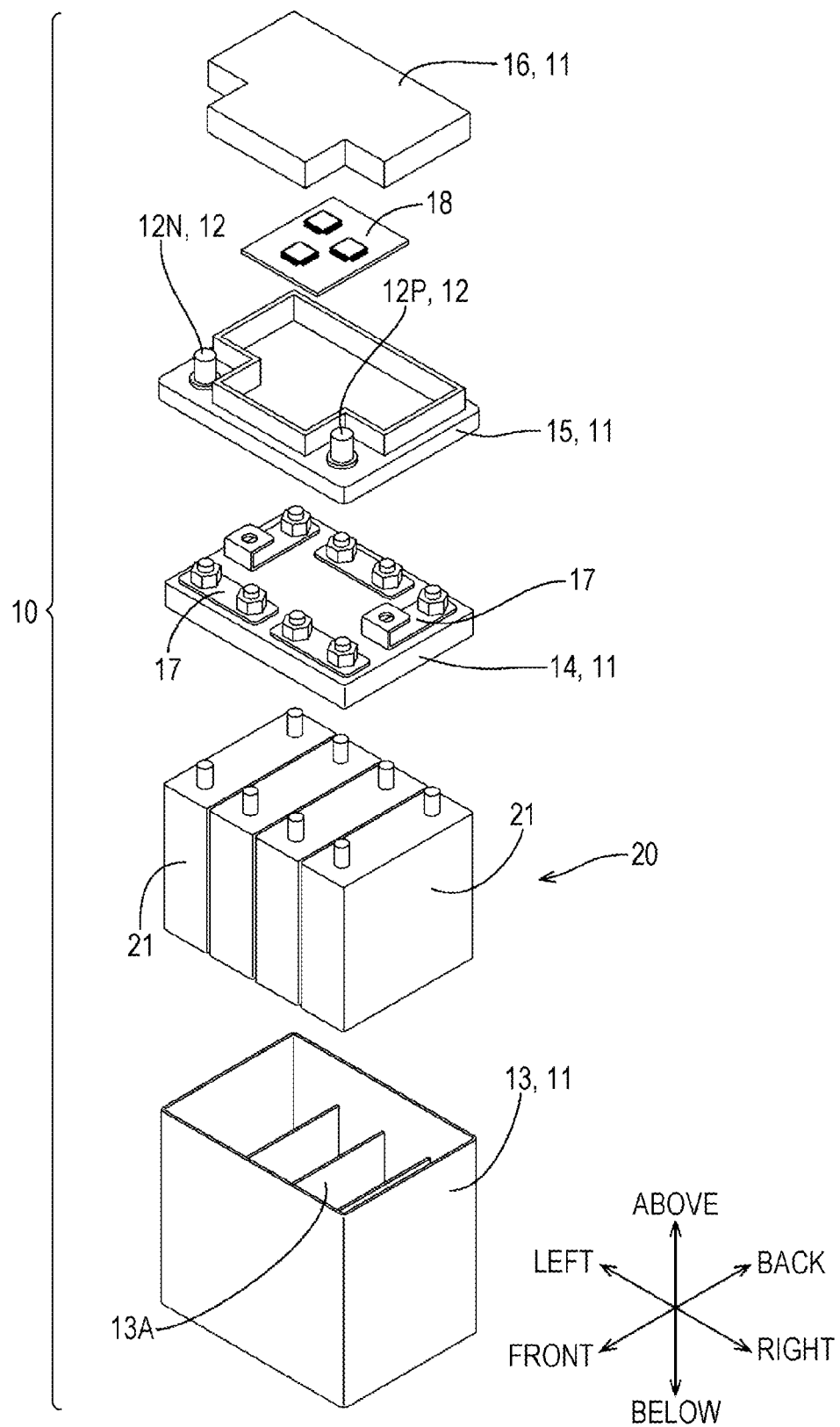
FIG. 2 is an exploded perspective view showing the energy storage apparatus.

The energy storage apparatus 10 includes a block-like battery case 11, as shown in FIG. 1. As shown in FIG. 2, an assembled battery 20 including a plurality (four in the present embodiment) of energy storage devices 21 that are connected in series, a control substrate 18, and the like are housed inside of the battery case 11.

In FIG. 1 and FIG. 2 in the following description, a vertical direction is referred to as a vertical direction of the battery case 11 that is horizontally put on an installation plane without any inclination. A front-back direction is referred to as a direction (backward) along the short side of the battery case 11, wherein the front left side in the drawings being regarded as the front. In addition, a lateral direction is referred to as a direction along the long side of the battery case 11, a front right side being regarded as the right.

The battery case 11 is made of a synthetic resin. As shown in FIG. 2, the battery case 11 includes a box-shaped case body 13 that is opened upward, a positioning member 14 for positioning the plurality of energy storage devices 21, an inner lid 15 disposed at the upper portion of the case body 13, and an upper lid 16 put on the inner lid 15.

As shown in FIG. 2, a plurality of cell chambers 13A, which respectively contain the energy storage devices 21 therein, are laterally arranged inside of the case body 13.

Each of the energy storage devices 21 is a lithium ion battery including a negative active material made of, for example, a graphite-based material and a ferric phosphate-based positive active material made of, for example, lithium iron phosphate.

As shown in FIG. 2, a plurality of bus bars 17 are mounted on the positioning member 14. The assembled battery 20 is configured such that the positioning member 14 is disposed above the plurality of energy storage devices 21 housed inside of the case body 13 so that the plurality of energy storage devices 21 are positioned and connected in series via the plurality of bus bars 17.

As shown in FIG. 1 and FIG. 2, the inner lid 15 is formed into a substantial rectangle, as viewed on a plane with a difference in height in the lateral direction. At both lateral ends of the inner lid 15 are disposed a pair of outside terminals 12 connected to battery terminals, not shown, disposed on a vehicle in a manner embedded in the inner lid 15. The pair of outside terminals 12 are made of metal such as a lead alloy. One of the pair of outside terminals 12 functions as a positive electrode terminal 12P whereas the other functions as a negative electrode terminal 12N.

As shown in FIG. 2, the inner lid 15 can contain the control substrate 18 therein. When the inner lid 15 is disposed in the case body 13, the assembled battery 20 and the control substrate 18 come to be connected to each other.

Next, a description will be given of the electric configuration of the energy storage apparatus 10.

Figure 3:
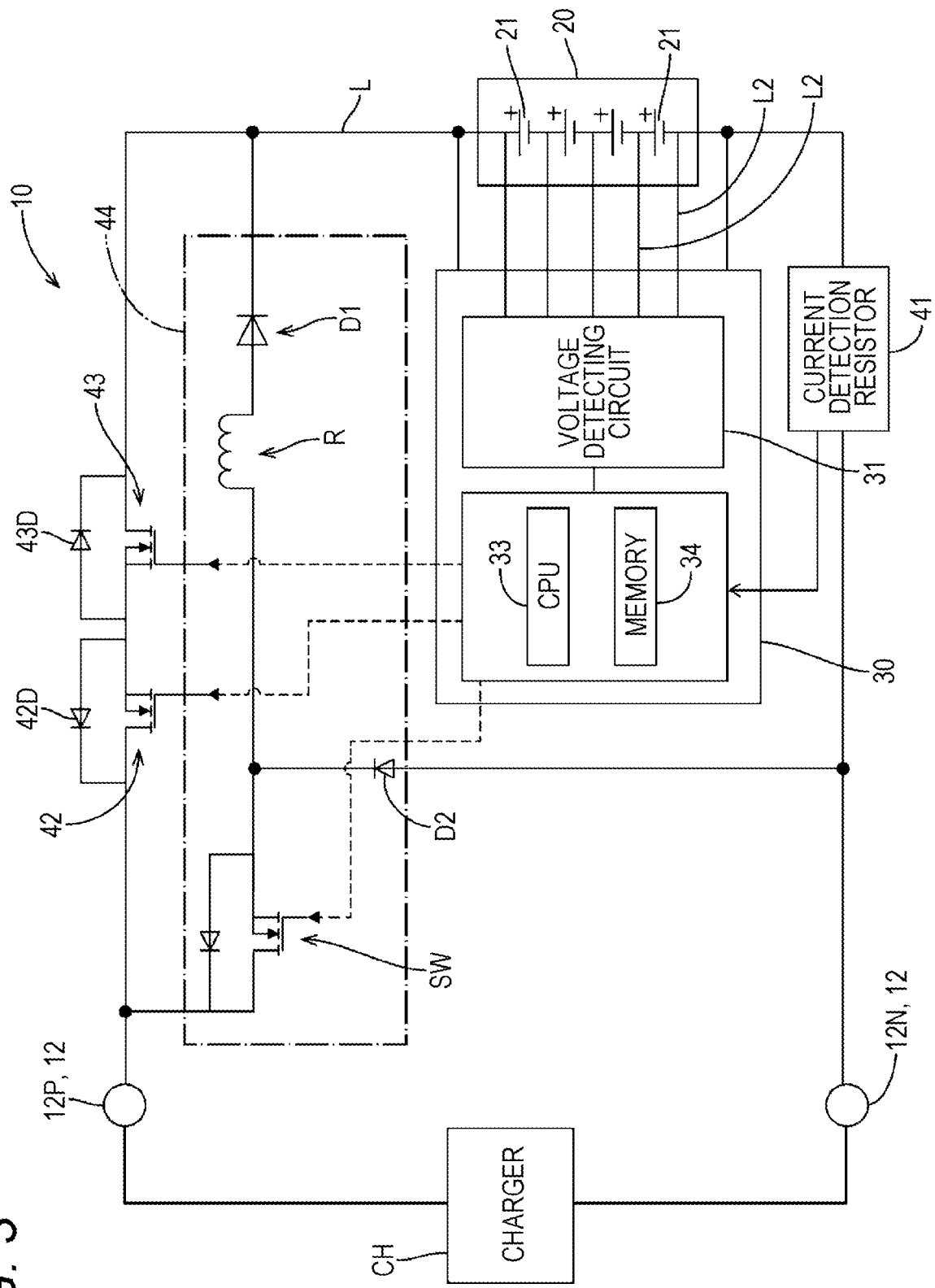
FIG. 3 is a block diagram illustrating the electric configuration of the energy storage apparatus in the first embodiment.

As illustrated in FIG. 3, the energy storage apparatus 10 includes the assembled battery 20, a battery management unit (hereinafter referred to as a "BMU") (exemplifying a "control unit") 30, a current detection resistor 41, a charge breaking device 42, a discharge breaking device 43, and a waveform-shaping circuit 44.

The assembled battery 20, the current detection resistor 41, the charge breaking device 42, and the discharge breaking device 43 are connected in series via an energization path L. The assembled battery 20 is connected on the positive electrode side thereof to the positive electrode terminal 12P via the charge breaking device 42 and the discharge breaking device 43 whereas on the negative electrode side thereof to the negative electrode terminal 12N via the current detection resistor 41.

The current detection resistor 41 is a resistor for detecting the current of the assembled battery 20. When voltages at both ends of the current detection resistor 41 are taken into the BMU 30, the current of the assembled battery 20 is detected.

The charge breaking device 42 and the discharge breaking device 43 are, for example, N-channel FETs, having parasitic diodes 42D and 43D, respectively. The respective drains of the charge breaking device 42 and the discharge breaking device 43 are commonly connected to each other. The source of the charge breaking device 42 is connected to the positive electrode terminal 12P whereas the source of the discharge breaking device 43 is connected to the assembled battery 20.

The BMU 30 includes a voltage detecting circuit (exemplifying a "voltage detecting unit") 31, a CPU abbreviating a central processing unit (exemplifying a "control unit") 33, and a memory 34. These constituent elements are mounted on the control substrate 18. In addition, the BMU 30 is connected to the energization path L so as to receive electric power from the assembled battery 20.

The voltage detecting circuit 31 is connected to each of both ends of each of the energy storage devices 21 via voltage detection lines L2, and thus, the cell voltage V1 of each of the energy storage devices 21 and the battery voltage (i.e., the total voltage of the plurality of energy storage devices 21) V2 of the assembled battery 20 are detected in response to an instruction from the CPU 33.

The memory 34 is, for example, a flash memory or a non-volatile memory such as an EEPROM. The memory 34 stores therein various programs used for managing each of the energy storage devices 21 or the assembled battery 20, data required for executing the various programs such as the cell voltage charge threshold of the energy storage device 21, the battery voltage charge threshold of the assembled battery 20, the cell voltage discharge threshold of the energy storage device 21, and the battery voltage discharge threshold of the assembled battery 20.

The CPU 33 is adapted to monitor the current, voltage, or the like of the energy storage device 21 based on outputs from the current detection resistor 41 or the voltage detecting circuit 31. In the case of the detection of abnormality, the CPU 33 performs a battery protecting process for actuating the charge breaking device 42 and the discharge breaking device (exemplifying "energization control unit" and the "current breaking device") 43 so as to prevent the occurrence of a malfunction at the assembled battery 20.

Figure 4:
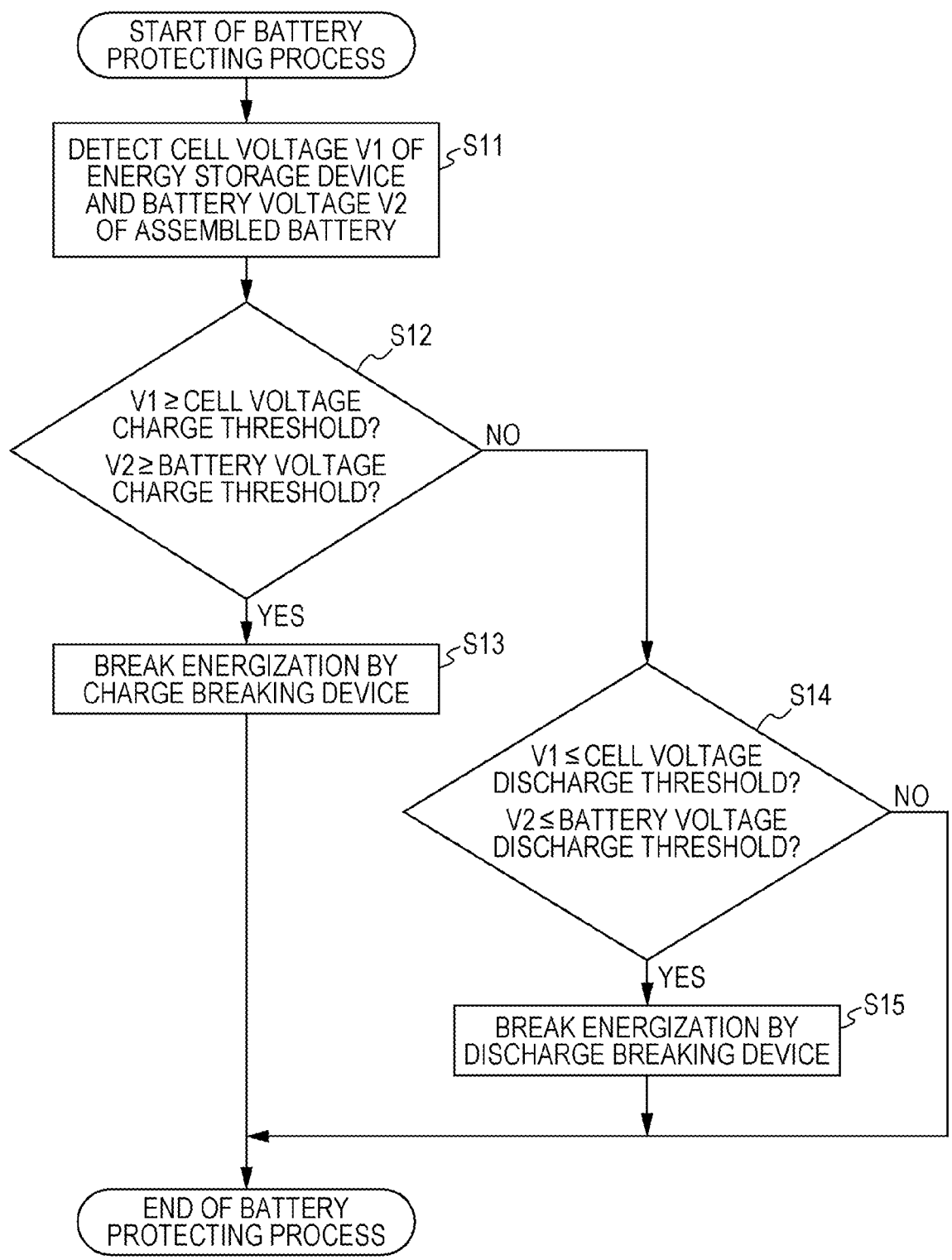
FIG. 4 is a flowchart illustrating a battery protecting process.

Explanation will be made below on the battery protecting process with reference to FIG. 4.

In the battery protecting process, first, the CPU 33 detects the cell voltage V1 of each of the energy storage devices 21 and the battery voltage V2 of the assembled battery 20 in the voltage detecting circuit 31 (S11), and then, compares the cell voltage V1 and the battery voltage V2 with the cell voltage charge threshold and the battery voltage charge threshold that have been stored in the memory 34 (S12).

Here, the cell voltage charge threshold signifies a slightly smaller value than a voltage value of one of the energy storage devices 21 in an overcharged state. The battery voltage charge threshold signifies a slightly smaller value than a voltage value of the assembled battery 20 in an overcharged state.

In the case where it is determined that any of the cell voltages V1 are equal to or higher than the cell voltage charge threshold, or the battery voltage V2 is equal to or higher than the battery voltage charge threshold (S12: YES), the CPU 33 determines that either one of the assembled battery 20 and the energy storage device 21 may be accidentally turned into the overcharged state, and thus, transmits a breakage switching instruction for use in breaking a current at the charge breaking device 42. Thereafter, the CPU 33 switches the charge breaking device 42 into a broken state, so as to cut the energization between the assembled battery 20 and the positive electrode terminal 12P, thus refraining the assembled battery 20 from being turned into the overcharged state (S13).

Here, even after the charge breaking device 42 is switched into the broken state, discharging can be kept via the parasitic diode 42D of the charge breaking device 42.

In the meantime, in the case where it is determined that all of the cell voltages V1 are smaller than the cell voltage charge threshold, and furthermore, that the battery voltage V2 is smaller than the battery voltage charge threshold (S12: NO), the CPU 33 compares each of the cell voltages V1 and the battery voltage V2 with the cell voltage discharge threshold and the battery voltage discharge threshold stored in the memory 34 (S14). Here, the cell voltage discharge threshold takes a slightly greater value than a voltage of one of the energy storage devices 21 in an overdischarged state, and furthermore, the battery voltage discharge threshold is a slightly greater value than a voltage value of the assembled battery 20 in the overdischarged state.

In the case where it is determined that any of the cell voltages V1 are equal to or lower than the cell voltage discharge threshold or that the battery voltage V2 is equal to or lower than the battery voltage discharge threshold (S14: YES), the CPU 33 determines that either one of the assembled battery 20 and the energy storage device 21 may be accidentally turned into the overdischarged state, so as to transmit a breakage switching instruction to the discharge breaking device 43.

Thereafter, the energization between the assembled battery 20 and the positive electrode terminal 12P is cut by switching the discharge breaking device 43 into the broken state, thus refraining the assembled battery 20 from being turned into the overdischarged state (S15).

Incidentally, even after the discharge breaking device 43 is switched to the broken state, charging can be kept via the parasitic diode 43D of the discharge breaking device 43. In the present embodiment, step S15 corresponds to a breaking process for breaking the energization for charging each of the energy storage devices 21.

In the meantime, in the case where it is determined that all of the cell voltages V1 are greater than the cell voltage discharge threshold, and furthermore, the battery voltage V2 is greater than the battery voltage discharge threshold (S14: NO), the CPU 33 ends the battery protecting process.

Repeating the battery protecting process all the time or periodically prevents the assembled battery 20 from being turned into the overcharged state or the overdischarged state.

The waveform-shaping circuit (exemplifying "energization control unit") 44 is connected between the outside terminals 12 and the assembled battery 20 in parallel with the charge breaking device 42 and the discharge breaking device 43.

As illustrated in FIG. 3, the waveform-shaping circuit 44 includes a semiconductor switch SW, a reactor R, a discharge preventing diode D1, and a reflux diode D2.

The semiconductor switch SW is an N-channel field-effect transistor (abbreviated as FET), wherein a drain is connected to the positive electrode terminal 12P and a source is connected to the reactor R. The semiconductor switch SW is designed to receive a control signal from the CPU 33, and to break a current in response to the control signal from the CPU 33.

The reactor R is connected at one end thereof to the drain of the semiconductor switch SW whereas at the other end thereof to the energization path L on the positive electrode side of the assembled battery 20 via the discharge preventing diode D1. The discharge preventing diode D1 is connected at a cathode thereof to the energization path L on the positive electrode side of the assembled battery 20 whereas at an anode thereof to the reactor R. The reflux diode D2 is connected at a cathode thereof to an intermediate connection point between the semiconductor switch SW and the reactor R whereas at an anode thereof to the ground line.

The CPU 33 is adapted to controllably switch the semiconductor switch SW at the waveform-shaping circuit 44 in a predetermined cycle, so as to reduce the charge voltage (an output voltage) of an outside charger CH.

Specifically, when the semiconductor switch SW is turned on, a current flows in the reactor R that then accumulates magnetic energy. When the semiconductor switch SW is switched off, the reactor R releases the accumulated magnetic energy via the reflux diode D2. Periodic repeating of this operation can reduce the voltage. Here, the semiconductor switch SW can change a duty ratio so as to adjust the output voltage of the waveform-shaping circuit 44.

In other words, the semiconductor switch SW can switch a duty ratio so as to adjust a voltage reduction quantity.

Specifically, the waveform-shaping circuit controllably switches the semiconductor switch SW so as to reduce the charge voltage, thus reducing the fluctuation of the charge voltage. In this manner, the waveform-shaping circuit can shape the waveform of an applied voltage to the assembled battery so as to smoothen the charge current.

The present embodiment is configured as described above. Subsequently, explanation will be made on the function and effect of the energy storage apparatus 10.

In the energy storage device such as a lithium ion battery having a ferric phosphate-based positive active material or negative electrode plate substrate that are made of a copper foil, a change in cell voltage as time passes in the case of charging for a short period of time at constant current charging (a charge current I) will be described. The cell voltage abruptly rises at the start time Ti of charging, and then, increases with a constant inclination within a predetermined reference range Va, as illustrated in, for example, FIG. 5. Thereafter, the cell voltage speedily decreases within the reference range after the end time Te of stopping charging.

In general, in the energy storage device such as a lithium ion battery having a ferric phosphate-based positive active material or negative electrode plate base material using a copper foil, copper contained in an electrode is eluded into an electrolyte solution in an overdischarged state. As a result, if charging is kept in a state in which copper contained in an electrode is eluded into an electrolyte solution, eluded copper ions are turned into copper that is deposited on the electrode. After that, the deposited copper grows, thereby inducing a risk of the breakage of a separator so as to cause an internal short-circuit. If an internal short-circuit occurs inside of the energy storage device, a change in cell voltage of the energy storage device as time passes tends to go out of the reference range Va illustrated in FIG. 5.

Figure 5:
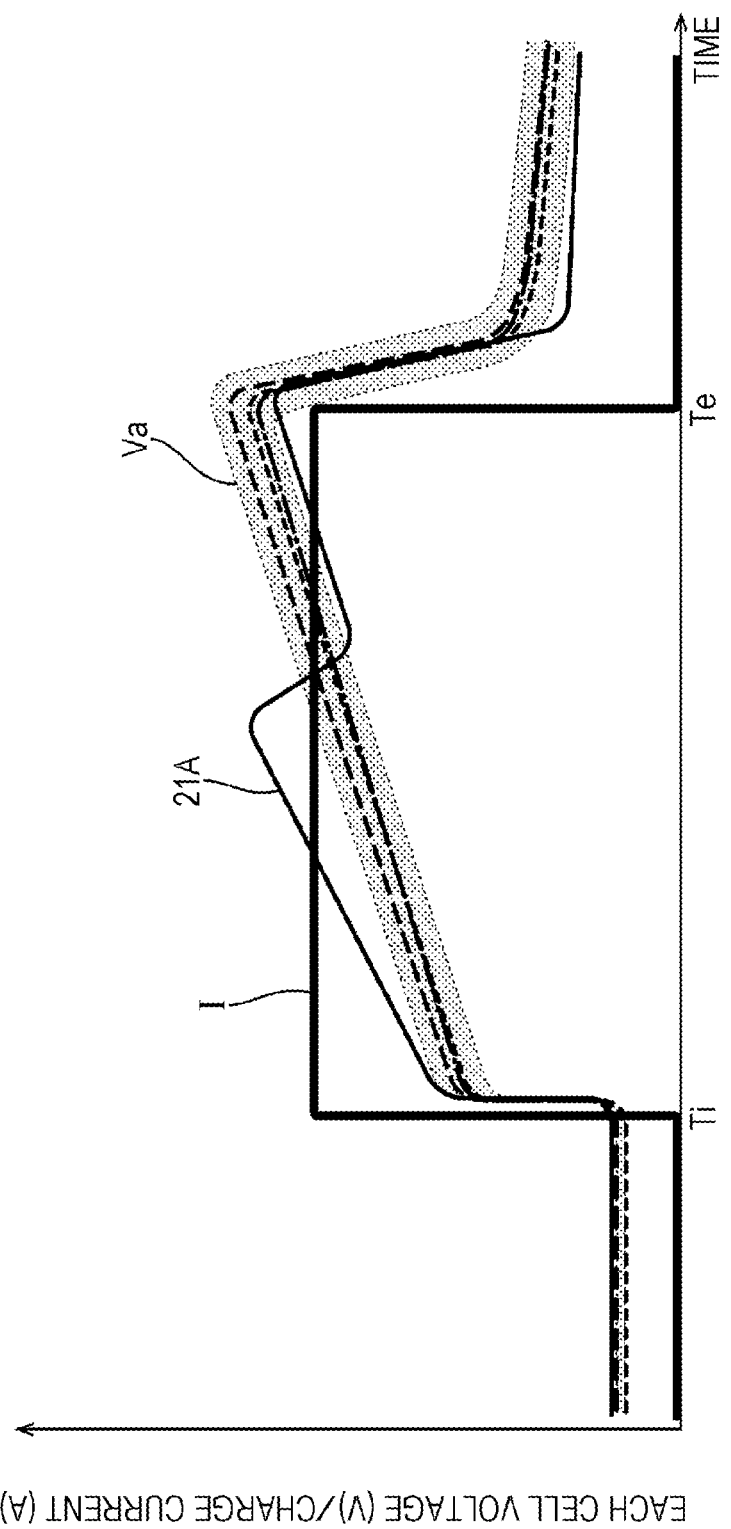
FIG. 5 is a graph schematically illustrating changes in cell voltage and charge current of an energy storage device as time passes.
Figure 6:
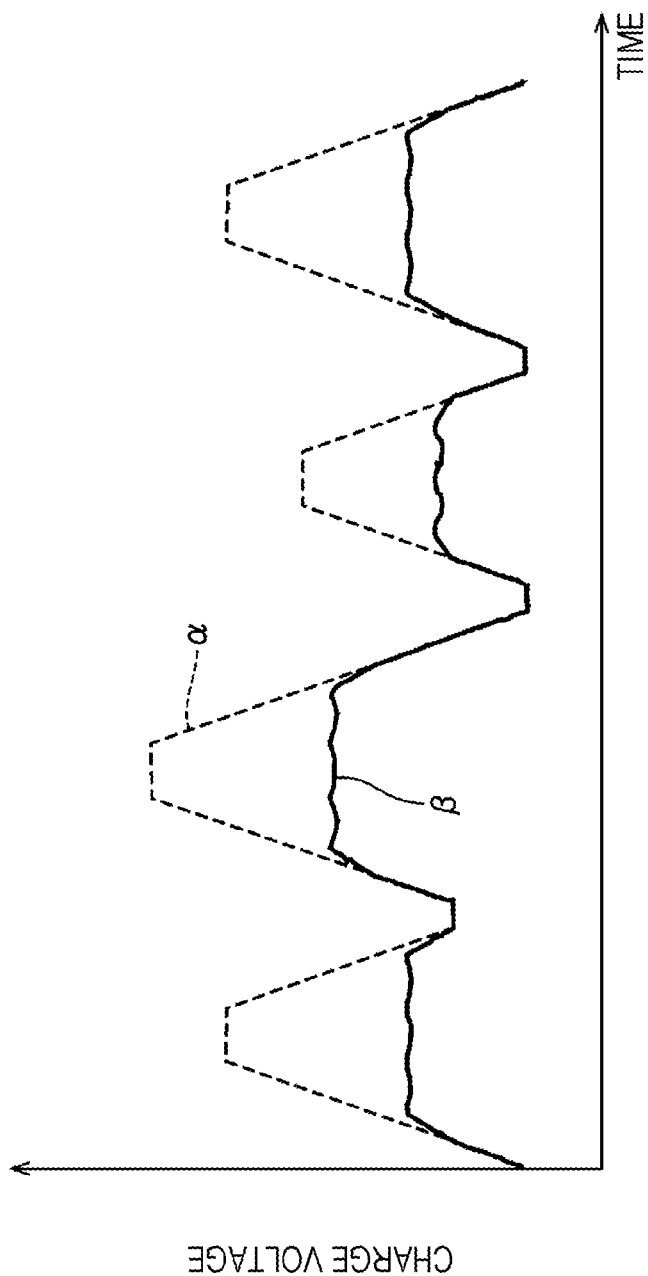
FIG. 6 is a graph schematically illustrating a charge voltage using a waveform-shaping circuit.

In view of the above, the CPU 33 performs a short-circuit detecting process for detecting the internal short-circuit of the energy storage device 21 based on various kinds of programs stored in the memory 34 and the reference range Va illustrated in FIG. 5. The CPU 33 performs the short-circuit detecting process in the case where charging is performed in connection with the outside charger CH to the outside terminals 12 in the energy storage apparatus 10 after the energization is broken at the discharge breaking device 43 in the battery protecting process.

Here, the start of charging by the outside charger CH is determined by, for example, detecting the voltage of the outside terminals 12 by the voltage detecting circuit 31 or detecting a charge current in response to an output from the current detection resistor 41 in the CPU 33.

A description will be given below of the short-circuit detecting process with reference to FIG. 7.

In the short-circuit detecting process, the CPU 33 first starts the switching control of the semiconductor switch SW in the waveform-shaping circuit 44 so as to reduce the charge voltage, thus starting charging (S21). At the same time, the CPU 33 starts counting time (S22). Specifically, the charge voltage is reduced in the waveform-shaping circuit 44, so that the fluctuation of the charge voltage is reduced, and the charging of the assembled battery 20 is started in the state in which the charge current is smoothened. At the same time, a charge time Tc is started to be counted.

The CPU 33 stops the switching control of the semiconductor switch SW when the charge time Tc passes a short-circuit detection charge time Ts stored in the memory 34 (S23: YES), and then, stops the charging to the assembled battery 20 (S24). In other words, the assembled battery 20 is charged for a short period of time during a short-circuit detection charge time Ts at the charge current smoothened by the waveform-shaping circuit 44.

Moreover, the CPU 33 determines whether or not a change (a behavior) ΔV in cell voltage V1 at each of the energy storage devices 21 deviates from the reference range Va during this short-circuit detection charge time Ts (S25).

Figure 7:
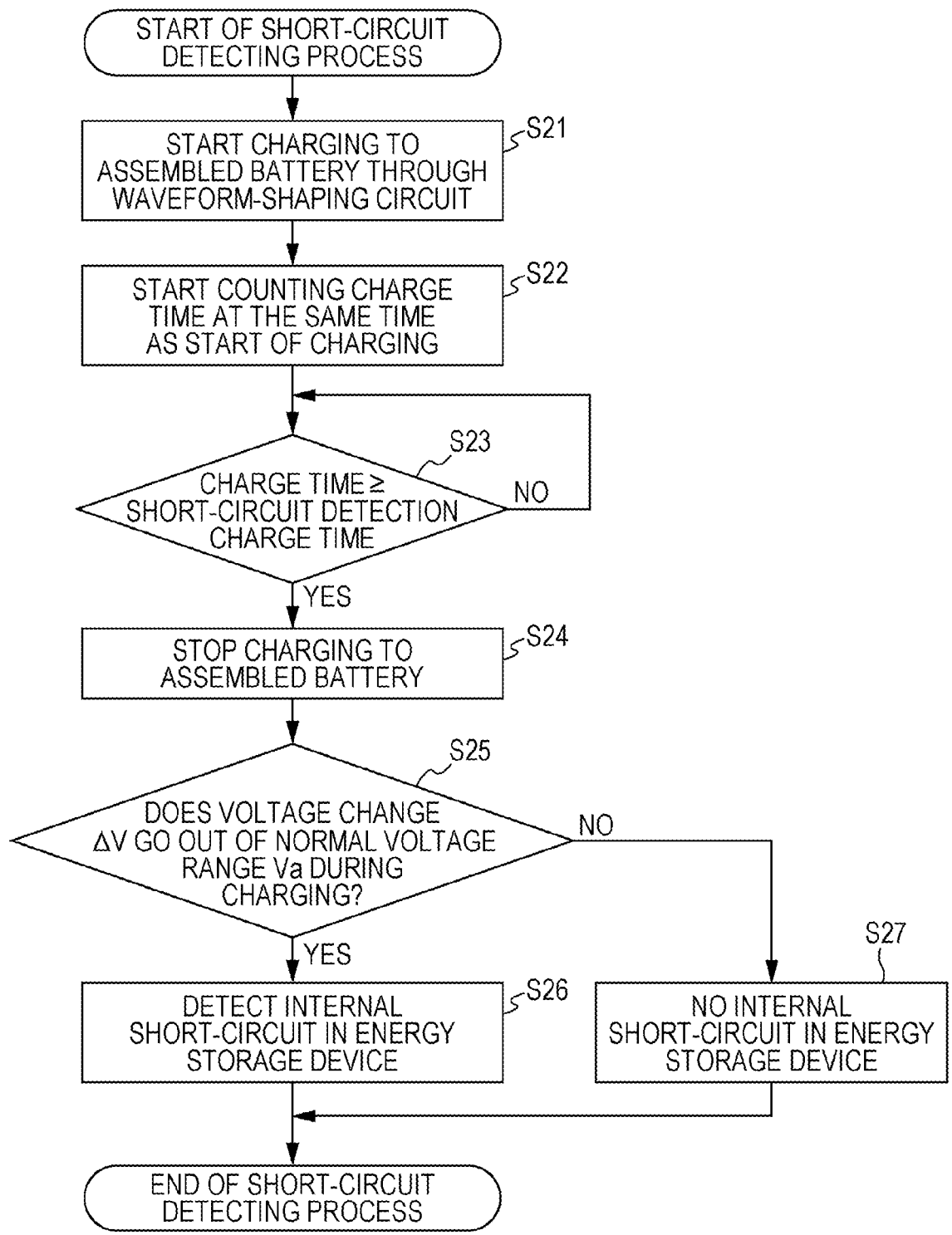
FIG. 7 is a flowchart illustrating a short-circuit detecting process.

In the case where the change ΔV in cell voltage V1 at any of the energy storage devices 21 deviates from the reference range Va, as illustrated in FIG. 7, (S25: YES), the CPU 33 detects the internal short-circuit of the energy storage device 21 (S26).

Specifically, the CPU 33 starts charging with respect to the assembled battery 20 through the waveform-shaping circuit 44. The charging is performed for a short period of time during the short-circuit detection charge time Ts of, for example, several hundred milliseconds to several seconds. As illustrated in FIG. 5, in the case where the ratio of a change in cell voltage V1 at an energy storage device 21A out of the plurality of energy storage devices 21 is larger and deviates from the reference range Va, the CPU 33 detects that an internal short-circuit occurs at the energy storage device 21.

In the meantime, in the case where changes ΔV in cell voltage V1 at all of the energy storage devices 21 fall within the reference range Va and do not go out of the reference range Va, the CPU 33 determines that no internal short-circuit occurs at the energy storage devices 21. The CPU 33 repeatedly performs the short-circuit detecting process a plurality of times, for example, three or four times at a predetermined interval. In this manner, it is possible to enhance the detection accuracy of the internal short-circuit at each of the energy storage devices 21.

The short-circuit detecting process may be repeated plural times, for example, at time points when the charged state (SOC) of the energy storage device 21 reaches 5%, 30%, and 90% for the short-circuit detection charge time Ts.

Next, in the case where the CPU 33 determines that the change ΔV in cell voltage V1 at each of the energy storage devices 21 does not go out of the reference range Va and the charged state (SOC) of each of the energy storage devices 21 exceeds a short-circuit detection maximum capacity stored in the memory 34 during the repetition of the short-circuit detecting process, the CPU 33 performs a voltage change comparing process for comparing changes in cell voltages V1 of the energy storage devices. Here, the short-circuit detection maximum capacity signifies a charge capacity enough to detect the short-circuit of the energy storage device 21. For example, the SOC is set to 90% or more.

Figure 8:
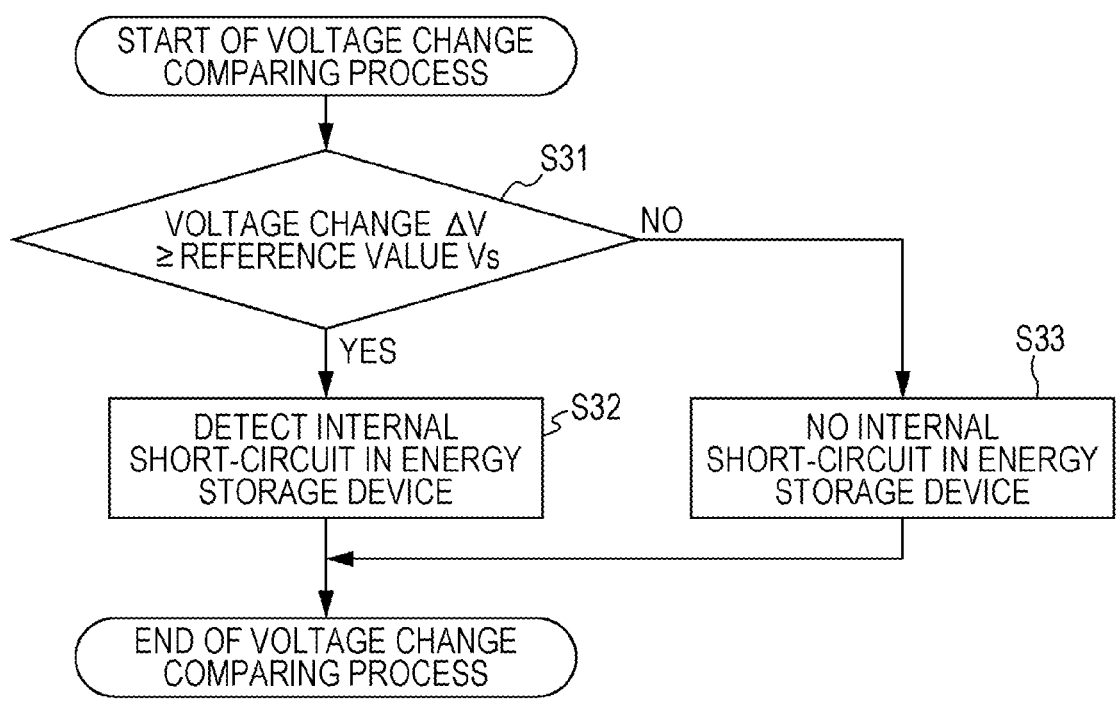
FIG. 8 is a flowchart illustrating a voltage change comparing process.

In the voltage change comparing process, as illustrated in FIG. 8, the CPU 33 compares the changes ΔV in voltage of the energy storage devices 21 by using the changes ΔV in cell voltage V1 of the energy storage devices 21 measured in the short-circuit detecting process (S31). In the case where a difference between the changes ΔV in voltage is equal to or greater than a reference value Vs stored in the memory 34 (S31: YES), the CPU 33 detects that an internal short-circuit occurs at any of the energy storage devices 21 (S32).

In the meantime, in the case where all of the changes ΔV in voltage are smaller than the reference value Vs (S31: NO), the CPU 33 determines that no internal short-circuit occurs at the energy storage devices 21 (S33).

Thereafter, in the case where no internal short-circuit at each of the energy storage devices 21 is detected in the voltage change comparing process as well, the CPU 33 performs a breakage releasing process for releasing breakage at the discharge breaking device 43 so as to achieve the energization between the outside terminals 12 and the assembled battery 20.

Specifically, in the present embodiment, it is checked in both of the short-circuit detecting process and the voltage change comparing process if an internal short-circuit occurs at each of the energy storage devices 21. In the case where no internal short-circuit is detected, the breakage of the discharge breaking device 43 is released and the energization between the outside terminals 12 and the assembled battery 20 is achieved, and thus, the assembled battery 20 can be charged again. In this manner, the energy storage apparatus 10 can be used again without any failure caused by the internal short-circuit.

In general, a charger including a simple control circuit is adversely influenced by the fluctuation of a voltage of a commercial 100 V power source. As indicated by a broken line α in FIG. 6, the waveform of an output voltage is unstable. Therefore, when the energy storage apparatus 10 is charged by the above-described charger, a voltage applied to the assembled battery 20, and furthermore, a charge current becomes unstable, thereby making it difficult to detect a change in cell voltage of each of the energy storage devices.

In the present embodiment, the waveform-shaping circuit (exemplifying "energization control unit") 44 is connected between the outside terminals 12 and the assembled battery 20 in parallel to the charge breaking device 42 and the discharge breaking device 43. The waveform-shaping circuit shapes the waveform of the applied voltage from the charger, as indicated by a solid line β in FIG. 6. As illustrated in FIG. 5, a charge current I can be smoothened. Thus, it is possible to facilitate the detection of the internal short-circuit based on the change in state of the energy storage device.

As described above, in the present embodiment, in the case where it is determined that the cell voltage V1 of each of the energy storage devices 21 or the battery voltage V2 of the assembled battery 20 is reduced less than the cell voltage charge threshold and the battery voltage charge threshold, the discharge breaking device 43 is broken, thus preventing the assembled battery 20 from being turned into the overdischarged state.

In the case where the outside charger CH is connected to the outside terminals 12 after the discharge breaking device 43 is broken, the CPU 33 of the BMU 30 charges the assembled battery 20 via the waveform-shaping circuit 44 for a short period of time, the short-circuit detecting process for determining whether or not each of the energy storage devices 21 deviates from the reference range Va is repeated a plurality of times.

In the short-circuit detecting process a plurality of times, in the case where it is determined that a change in cell voltage V1 of each of the energy storage devices 21 does not go out of the reference range Va and no internal short-circuit occurs, the voltage change comparing process is performed. In the case where the difference value between the changes ΔV in voltage of the energy storage devices 21 is less than the reference value, it is determined that no internal short-circuit occurs.

The detection accuracy of the internal short-circuit is enhanced by performing the short-circuit detecting process a plurality of times. Furthermore, only in the case where it is determined that no internal short-circuit occurs at each of the energy storage devices 21 in the voltage change comparing process, the breakage of the discharge breaking device 43 is released so that the assembled battery 20 can be charged again. As a consequence, the energy storage apparatus 10 can be kept used until an internal short-circuit occurs at the energy storage device 21, thus prolonging the lifetime of the energy storage apparatus 10.

Moreover, in the present embodiment, when the assembled battery 20 is charged in the short-circuit detecting process, the charge voltage is reduced so as to reduce the fluctuation of the charge voltage via the waveform-shaping circuit 44, thus shaping the waveform of the voltage applied to the energy storage device 21 and smoothing the charge current. As a consequence, it is possible to facilitate the detection whether or not the change in voltage of the energy storage device 21 deviates from the reference range Va. Thus, the detection accuracy of the internal short-circuit can be further enhanced in the present embodiment.

Second Embodiment

Figure 10:
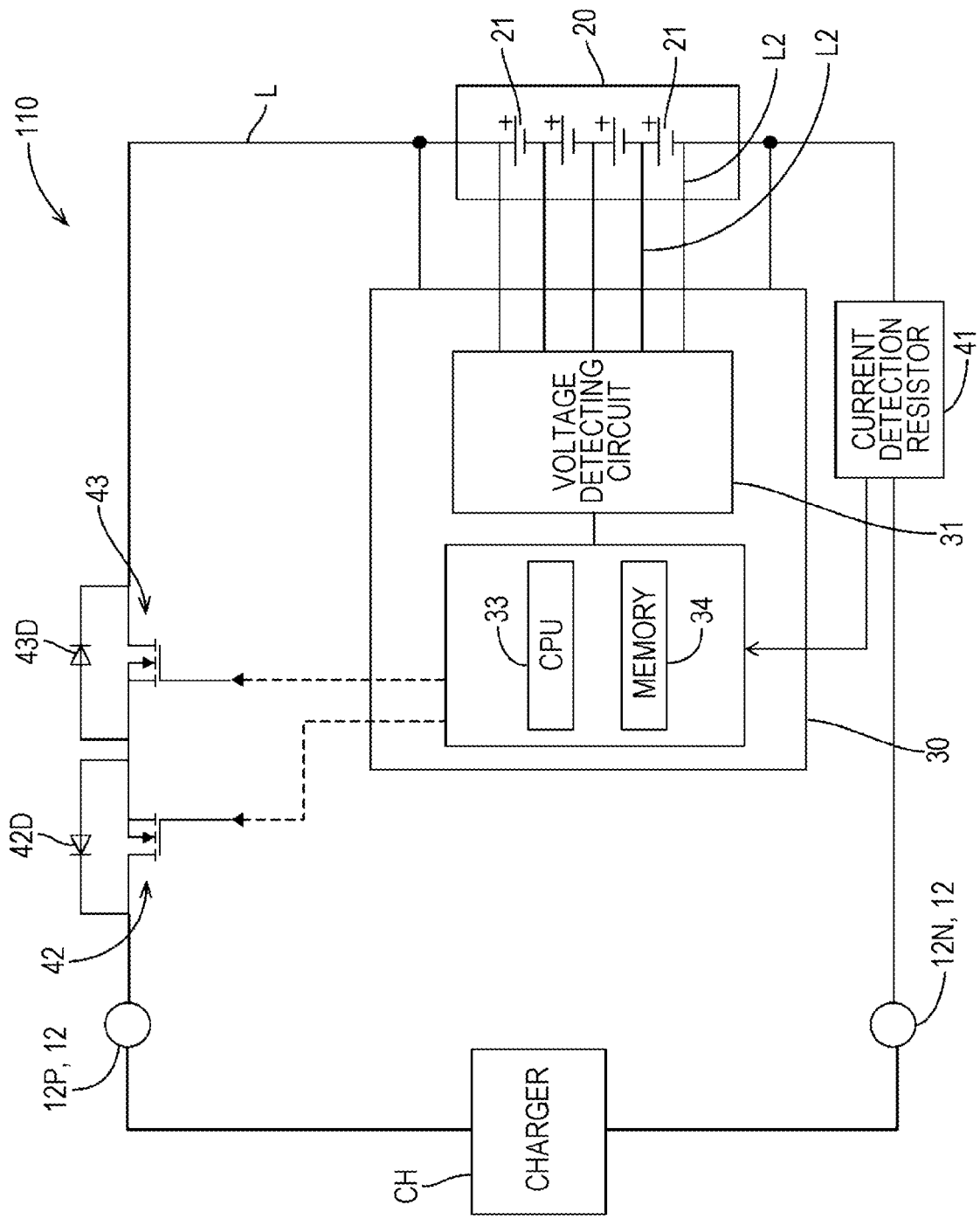
FIG. 10 is a block diagram illustrating the electric configuration of an energy storage apparatus in a second embodiment.

Subsequently, a second embodiment will be described with reference to FIG. 10.

In an energy storage apparatus 110 in the second embodiment, a part of the short-circuit detecting process is modified while eliminating the waveform-shaping circuit 44 in the electric configuration in the first embodiment. The configuration, function, and effect common to those in the first embodiment are duplicated, and therefore, their explanation will be omitted. Moreover, the same reference numerals are used for the same constituent elements as those in the first embodiment.

In a short-circuit detecting process in the second embodiment, first, a CPU 33 temporarily releases the breakage of energization at a discharge breaking device 43, starts to charge an assembled battery 20 at a constant voltage or a pulse, and stops the charging to the assembled battery 20 when a charge time Tc passes a short-circuit detection charge time Ts.

The CPU 33 determines whether or not a change (behavior) ΔV in cell voltage V1 at each energy storage device 21 deviates from a reference range Va during this short-circuit detection charge time Ts, thus detecting an internal short-circuit in the energy storage device 21.

Also in the present embodiment, only in the case where it is determined that no internal short-circuit occurs at each of the energy storage devices 21 in both of a short-circuit detecting process and a voltage change comparing process, the breakage of the discharge breaking device 43 is released, thus achieving the charging of the assembled battery 20 again. In this manner, the energy storage apparatus 10 can be kept used until an internal short-circuit occurs at the energy storage device 21, thus prolonging the lifetime of the energy storage apparatus 10.

Here, pulse charging in the present embodiment signifies charging for alternately repeating a supply period during which a charge current is supplied and a stop period in which it is not supplied. For example, the supply period and the stop period may be equal to each other or the supply period may be longer than the stop period.

Additionally, the shape of a pulse in the pulse charging may be rectangular or curved. More particularly, the shape of a pulse may be moderately increased in a curve or abruptly increased in a curve. Alternatively, the shape of a pulse may be moderately decreased in a curve or abruptly decreased in a curve.

Other Embodiments

The techniques disclosed in the present specification are not limited to the embodiments described with reference to the attached description and drawings. For example, various modes below may be encompassed.

Figure 11:
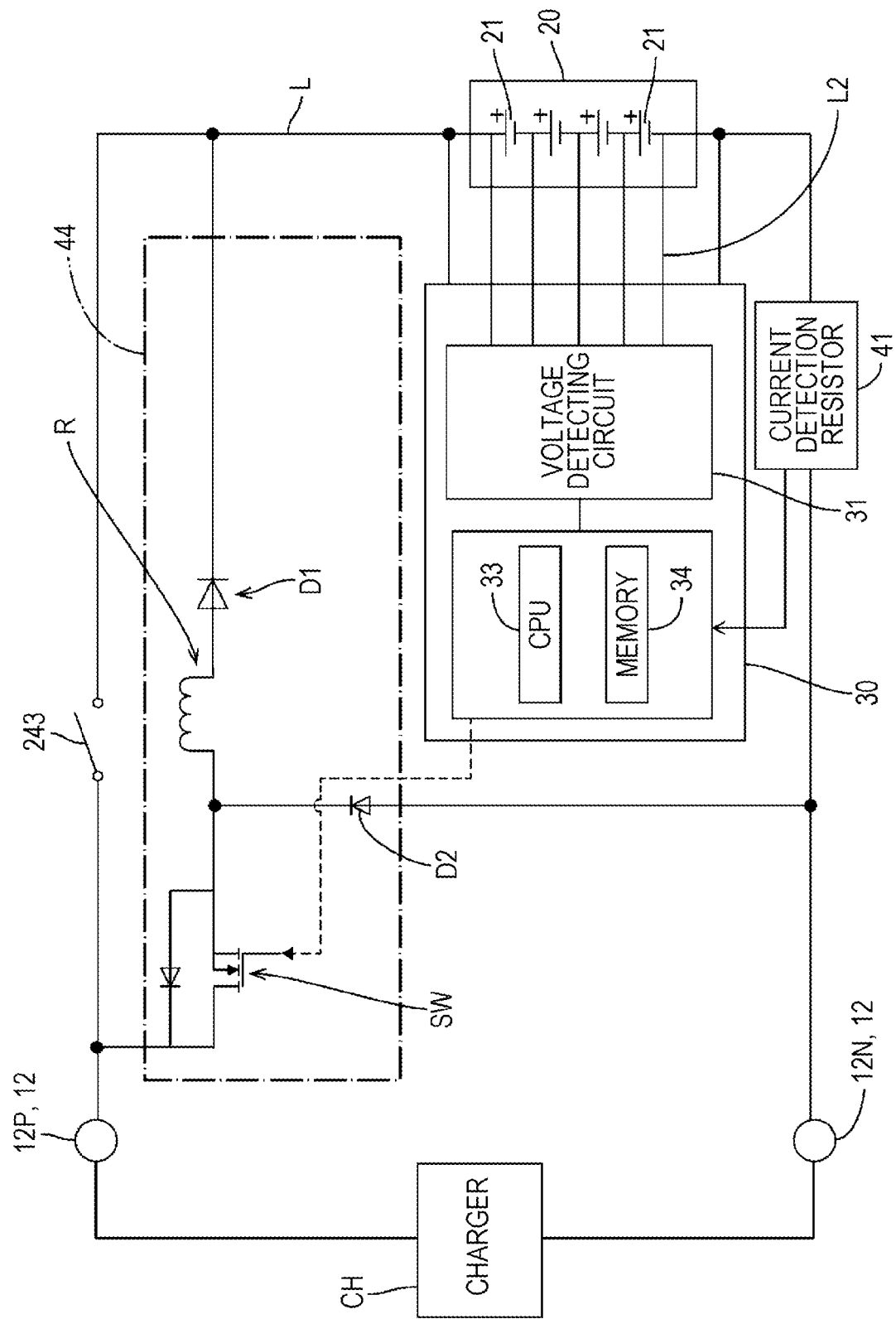
FIG. 11 is a block diagram illustrating the electric configuration of an energy storage apparatus in another embodiment.

(1) In the above-described embodiments, the charge breaking device 42 and the discharge breaking device 43 include MOSFETs. However, the present invention is not limited to this. The charge breaking device and the discharge breaking device may include relays. Furthermore, as illustrated in FIG. 11, only a relay-type discharge breaking device 243 may be installed without installing any charge breaking device.

(2) In the above-described embodiments, the short-circuit detecting process is repeated plural times. However, the present invention is not limited to this. The short-circuit detecting process may be performed only once or the short-circuit detecting process may be performed two times or four times or more.

(3) In the above-described embodiments, the short-circuit detecting process is performed, and then, the voltage change comparing process is performed. However, the present invention is not limited to this. Only the short-circuit detecting process may be performed or only the voltage change comparing process may be performed.

(4) In the above-described embodiments, the energy storage apparatus 10 is configured in such a manner as to start the engine mounted on the four-wheel vehicle M such as an automobile. However, the present invention is not limited to this. The energy storage apparatus may be configured in such a manner as to be mounted on a two-wheel vehicle.

What is claimed is:

1. An energy storage apparatus comprising:
   an energy storage device;
   a voltage detecting unit for detecting a voltage of the energy storage device;
   an energization control unit for controlling energization of the energy storage device; and
   a control unit, for:
   performing a breaking process for breaking the energization of the energy storage device when the voltage of the energy storage device becomes lower than a predetermined voltage;

after the performing of the breaking process, performing a short-circuit detecting process for detecting an internal short-circuit based on a change in state of the energy storage device with charging of the energy storage device; and performing a breakage releasing process for releasing the breakage of the energy storage device energization to enable the energy storage device to be charged again if no internal short-circuit of the energy storage device is detected in the short-circuit detecting process.

2. The energy storage apparatus according to claim 1, wherein the control unit detects the internal short-circuit of the energy storage device if a change in voltage of the energy storage device during charging in the short-circuit detecting process deviates from a predetermined reference range.

3. The energy storage apparatus according to claim 1, wherein the energy storage device comprises a plurality of energy storage devices connected in series, and the control unit compares changes in state of the energy storage devices after charging in the short-circuit detecting process to detect the internal short-circuit of the energy storage device.

4. The energy storage apparatus according to claim 1, wherein the energy storage device comprises a plurality of energy storage devices connected in series, and the control unit determines whether a change in voltage of the energy storage device during charging in the short-circuit detecting process deviates from a predetermined reference range and compares changes in state of the energy storage devices after charging in the short-circuit detecting process to detect the internal short-circuit of the energy storage device.

5. The energy storage apparatus according to claim 1, wherein the control unit performs the short-circuit detecting process a plurality of times.

6. The energy storage apparatus according to claim 1, wherein the energization control unit includes:

a current breaking device for breaking an energization path to the plurality of energy storage devices; and a waveform-shaping circuit connected in parallel to the current breaking device, and the control unit breaks the energization path and switches the energization of the plurality of energy storage devices to energization via the waveform-shaping circuit to charge the energy storage devices.

7. The energy storage apparatus according to claim 1 for starting an engine for a vehicle.

8. A vehicle mounting thereon the energy storage apparatus according to claim 1.

9. An internal short-circuit detection controlling method for an energy storage apparatus having an energy storage device, the method comprising:

performing a short-circuit detecting process in which an internal short-circuit of the energy storage device is detected if a change in voltage of the energy storage device during charging deviates from a predetermined reference range.

10. A charge controlling method for an energy storage apparatus having an energy storage device, the method comprising:

breaking energization of the energy storage device when a voltage of the energy storage device becomes lower than a predetermined voltage;

detecting an internal short-circuit based on a change in state of the energy storage device with charging of the energy storage device after the breaking; and releasing the breakage of the energy storage device energization if no internal short-circuit of the energy storage device is detected to enable the energy storage device to be charged again.

11. The energy storage apparatus according to claim 1, further comprising:

an assembled battery comprising a plurality of energy storage devices including the energy storage device; and a positive electrode terminal connected to the assembled battery via an energization path, wherein the energization control unit comprises a current breaking device formed in the energization path.

12. The energy storage apparatus according to claim 11, wherein the current breaking device comprises:

a charge breaking device comprising a first field effect transistor (FET) including a source connected to the positive electrode terminal; and a discharge breaking device comprising a second FET including a source connected to the assembled battery.

13. The energy storage apparatus according to claim 12, wherein a drain of the first FET is connected to a drain of the second FET.

14. The energy storage apparatus according to claim 12, wherein the charge breaking device further comprises a first diode connected in parallel with the first FET, and the discharge breaking device further comprises a second diode connected in parallel with the second FET.

15. The energy storage apparatus according to claim 11, wherein the energization control unit further comprises:

a waveform-shaping circuit connected in parallel with the current breaking device.

16. The energy storage apparatus according to claim 15, wherein the waveform-shaping circuit comprises:

a semiconductor switch comprising a field effect transistor (FET) including a source connected to the positive electrode terminal, the semiconductor switch breaking a current in the energization path in response to a control signal from the control unit;

a reactor connected to a drain of the FET;

a discharge preventing diode including:

a cathode connected to the energization path on a positive electrode side of the assembled battery; and an anode to the reactor; and a reflux diode including:

a cathode connected to an intermediate connection point between the semiconductor switch and the reactor; and an anode connected to the ground line.

17. The energy storage apparatus according to claim 16, wherein the control unit switches the semiconductor switch in a predetermined cycle so as to reduce a charge voltage of an outside charger connected to the energy storage apparatus for charging the energy storage apparatus, and wherein:

when the semiconductor switch is turned on, a current flows in the reactor that then accumulates magnetic energy; and when the semiconductor switch is switched off, the reactor releases the accumulated magnetic energy via the reflux diode.

18. The energy storage apparatus according to claim 17, wherein the short-circuit detecting process comprises:
- performing charging of the assembled battery including switching control of the semiconductor switch so as to reduce the charge voltage;
- counting a charge time of the charging;
- when the charge time passes a short-circuit detection charge time, stopping the switching control of the semiconductor switch and stopping the charging to the assembled battery; and
- detecting the internal short-circuit of the energy storage device if a change in cell voltage of the energy storage device deviates from a reference range during the charging.

* * * * *